United States Patent [19]
LeBlanc et al.

[11] Patent Number: 6,092,224
[45] Date of Patent: Jul. 18, 2000

[54] LOGIC ANALYZER PROBE ASSEMBLY WITH PROBE AND INTERFACE BOARDS

[75] Inventors: Michael LeBlanc, Austin; Davoud Safari, Round Rock; Edwin Smith, Leander, all of Tex.

[73] Assignee: Compaq Computer Corporation, Houston, Tex.

[21] Appl. No.: 09/086,002

[22] Filed: May 27, 1998

[51] Int. Cl.[7] .................................................. G01R 31/28
[52] U.S. Cl. ............................................................. 714/724
[58] Field of Search .............................. 714/724; 324/754, 324/755, 756, 757, 758, 76.11, 158.1

[56] References Cited

U.S. PATENT DOCUMENTS

| | | | |
|---|---|---|---|
| 5,162,728 | 11/1992 | Huppenthal | 324/158.1 |
| 5,227,718 | 7/1993 | Stowers et al. | 324/158.1 |
| 5,812,563 | 9/1998 | Hedlund et al. | 714/738 |
| 5,945,837 | 8/1999 | Fredrickson | 324/761 |

*Primary Examiner*—Hoa T. Nguyen
*Attorney, Agent, or Firm*—Fenwick & West LLP

[57] ABSTRACT

The Logic Analyzer Probe Board is a hardware design which allows convenient access to signals on a printed circuit board. On one side of the Probe Board assembly is a collection of probes that provide contact to the printed-circuit boards pads, pins, vias and test points on the non-component side of a UUT. The other side of the Probe Board assembly contains an organized collection of connectors, or headers, that connect to a logic analyzer's cable harness. When the Probe Board mates with the printed circuit board, the Probe Board taps into a printed circuit board's signal via the probe-to-pad connection and routes the detected signal via one of the header pins to the logic analyzer. The design of the printed circuit board includes test points that correspond to each signal under test. Once the layout of a printed circuit board is determined, a custom-designed Probe Board may be designed that is cable of accessing each test point.

13 Claims, 6 Drawing Sheets

TOP VIEW OF BALL GRID ARRAY PROCESSOR

BOTTOM VIEW OF BALL GRID ARRAY PROCESSOR

SIDE VIEW OF BALL GRID ARRAY PROCESSOR

LOGIC ANALYZER PROBE ASSEMBLY WITH PROBE AND INTERFACE BOARDS

TECHNICAL FIELD OF THE INVENTION

This invention relates generally to a method and apparatus for performing logic analysis of electronic test units, and more specifically, to a method and apparatus for performing logic analysis of circuit boards with a logic analyzer probe board that provides access to large numbers of low and high speed logical nets without significant signal degradation of the circuit board under test.

BACKGROUND OF THE INVENTION

New generations of printed circuit board manufacturing technologies are pushing higher density components and signals into smaller and smaller board dimensions. A significant contributing factor of this trend is the ever decreasing package size of computer chips. The decrease in the physical dimensions of computer chips has impacted the hardware development and printed wiring assembly (PWA) manufacturing environments where access to component pins is required to debug and test circuit board components.

As shown in FIG. 1A, a logic analyzer system 100 is an example of a system that includes a standard tool used for debugging printed circuit boards. A logic analyzer system 100 comprises a logic analyzer 102 that includes a Central Processing Unit (CPU) 104 and memory 106. An input device 110 such as a keyboard and mouse, a display device 112 such as a Cathode Ray Tube (CRT) display and a computer readable medium device 116 such as a CD ROM drive that receives input from computer readable medium 114 are coupled via signal buses 105, 107 and 108 to CPU 104. Memory 106 such as Read Only Memory (ROM) and Random Accessible Memory (RAM) are coupled via signal bus 105 to CPU 104.

With Logic Analyzer 102, engineers and technicians can display and study on display device 112 via bus 108 the sequence of signals executed within printed circuit board 118. Engineers can analyze these signal patterns to determine if the logic is executing correctly or, if not, they can use the data to pinpoint where the fault is occurring.

Conventional logic analyzers, such as logic analyzer 102, require component pins for capturing digital signals to analyze circuit board components such as chips. Access to assembled printed circuit board signals provided by typical component pins generally requires a delicate and expensive logic analyzer chip adapter. For example, chip adapters 128 and 130 require pins to capture the signals originating from components such as a processor 120, a driver 124 for disk 130 and a memory 126. It is particularly difficult to access signals across a bus such as bus 122.

FIG. 1B shows in detail chip adapter 130 clamped to pins 206 and 208 for capturing signals originating from memory component 126 which is mounted to circuit board 118. Logic analyzer leads 204 and 202 are used for connecting cables extending from logic analyzer 102 to chip adapter 130.

Due to the small dimensions and limited space between components, a logic analyzer chip adapter is typically unable to obtain unimpeded access of test points and in some cases may become detached during testing, resulting in a less than reliable testing mechanism.

Further, because pin counts are increasing into the 200–700 range per component, it has become increasingly more difficult to correctly identity and attach an adapter to the correct set of pins. Accordingly, such analysis requires expensive and delicate chip adapters.

Another problem for conventional logic analyzers is the need to use a large assortment of cable attachments and probes between the printed circuit board under test and the logic analyzer. Such cable attachments and probes are generally difficult to assemble and maintain so that circuit board testing is error prone, laborious and time consuming. Because the trend is toward more complex circuit boards this problem will only worsen as signal/component densities increase.

For example, FIG. 2 shows a diagram of the logic analyzer's conventional method of retrieving signal information. Due to the density of components mounted to circuit board 118 and due to high pin counts, there may be a need as shown in FIG. 2 to overlap chip adapters 136, 134, 132, 130 and 128. One of ordinary skill in the art will recognize that use of multiple chip adapters can lead to errors and frustration in an attempt to set up the logic analyzer adapters and cables.

Another problem for testing PWA's is that new integrated circuit technology such as "Ball Grid Array Devices," as shown in FIG. 3A and 3B, are devices mounted to circuit boards that do not provide pins which are accessible for debugging purposes. In order to test such components, conventional logic analyzers attach to one or more pins of another component via a trace that connects to the ball grid array device under test. Since indirect testing adds additional testing variables, this type of testing is less exact than direct testing and is prone to errors.

For example, FIG. 3A shows an example ball grid array processor 302 mounted within mounting frame 300 to circuit board 118. The top accessible side 304 of processor 302 does not include pins. Hence, pins are not available for establishing a connection with a chip adapter. FIG. 3B shows the bottom side of processor 302 where only ball endpoints 308 are available. FIG. 3C shows a side view of ball grid array processor 302 having ball endpoints 308 at the bottom side is mounted to circuit board 118. Accordingly, neither the top nor bottom side of processor 302 provides pins that are accessible for logic analyzer 102 testing.

As a result, there has been a longfelt need for a logic analyzer probe board that provides a logic analyzer quick and efficient access of each signal across an electronic unit under test (UUT), minimizes exposure to human error in performing signal analysis, and maintains the signal integrity of the unit under test—requirements never previously met by conventional logic analyzer systems.

SUMMARY OF THE INVENTION

The Logic Analyzer Probe Board, hereafter referred to as "Probe Board," is a hardware design which allows convenient access to signals on a printed circuit board. On one side of the Probe Board assembly is a collection of probes that provide contact to the printed-circuit boards pads, pins, vias and test points on the non-component side of a UUT. The other side of the Probe Board assembly contains an organized collection of connectors, or headers, that connect to a logic analyzer's cable harness. When the Probe Board mates with the printed circuit board, the Probe Board taps into a printed circuit board's signal via the probe-to-pad connection and routes the detected signal via one of the header pins to the logic analyzer. To prevent the probe from potentially interfering with signal quality, each probe includes a series resistor located close to the probe.

The design of the printed circuit board includes test points that correspond to each signal under test. Once the layout of a printed circuit board is determined, a custom-designed Probe Board may be designed that is capable of accessing each test point.

More specifically, the test point topology for the UUT must be copied into the Probe Board design where probes are placed for each test point X-Y location. Mounting holes, or actuators, must be included in the UUT design that allow the Probe Board to be aligned and attached to the UUT with the aide of screws. The X-Y location for all screws must be included in the Probe Board design so that these holes align properly with those of the UUT design. Guide pin holes may be included in the UUT design and the Probe Board design to provide additional stability between the Probe Board and the UUT and to aid in the alignment of the Probe Board to the UUT during the attachment of the Probe Board.

Components on the backside of the UUT that are taller in height than the travel distance of the spring-loaded probes must have a matching cavity in the probe plate.

The Probe Board may be used by engineers during product development. More particularly, a boards design must be verified via debugging before it will be manufactured according to developer specifications. Since an initial board design may include hardware defects or logical design errors, each flaw must be identified early or it may otherwise impede the production cycle. In order to identify problems early in the development and design cycle, the Probe Board improves the testing verification process by providing an efficient and reliable interface between the logic analyzer and the board under test.

The Probe Board can also be useful for debugging while manufacturing printed circuit boards. Significant company resources are generally expended to debug printed circuit boards. For instance, it generally requires significant time to connect a conventional logic analyzer to debug each board under test. This is particularly true for complex boards that generally require numerous probe attachments in order to analyze a required collection of signals. This amount of time can easily increase if there is an intermittent connection between a component and a logic analyzer of if the technician mistakenly attaches a probe to the wrong signal.

The Probe Board resolves each of the connection problems described above. The Probe Board makes consistent and reliable connections with the board under test. Each signal tested by the Probe Board is conveniently labeled and grouped together into a connector according to specific functional tests so that the logic analyzer can easily attach to the connector with minimal opportunity of error. Also, logic analyzer connections can remain in place when testing a plurality of boards since the technician only has to remove the Probe Board without removing the testing attachments. When the logic analyzer begins to debug the next board the technician need only attach the Probe Board which already includes the logic analyzer testing configuration. Hence, the Probe Board promotes "time savings" that can decrease debugging costs.

The Probe Board promotes signal access. Since many new component packages have pins located on the bottom of the package so that once the component is mounted on a board the pins are not directly accessible. Without direct pin access, in order to test the components the probe board technicians generally follow the signals from the component under test to another component that includes accessible pins. The Probe Board is therefore able to provide easy access to signals on new component packages that do not include pins.

The invention may be better appreciated from the following figures, taken together with the accompanying Detailed Description of the Invention.

DESCRIPTION OF THE PREFERRED EMBODIMENTS

The following description is of the best presently contemplated mode of carrying out the invention. The description is made for the purpose of illustrating the general principles of the invention and is not to be taken in a limiting sense.

Figure 1A:
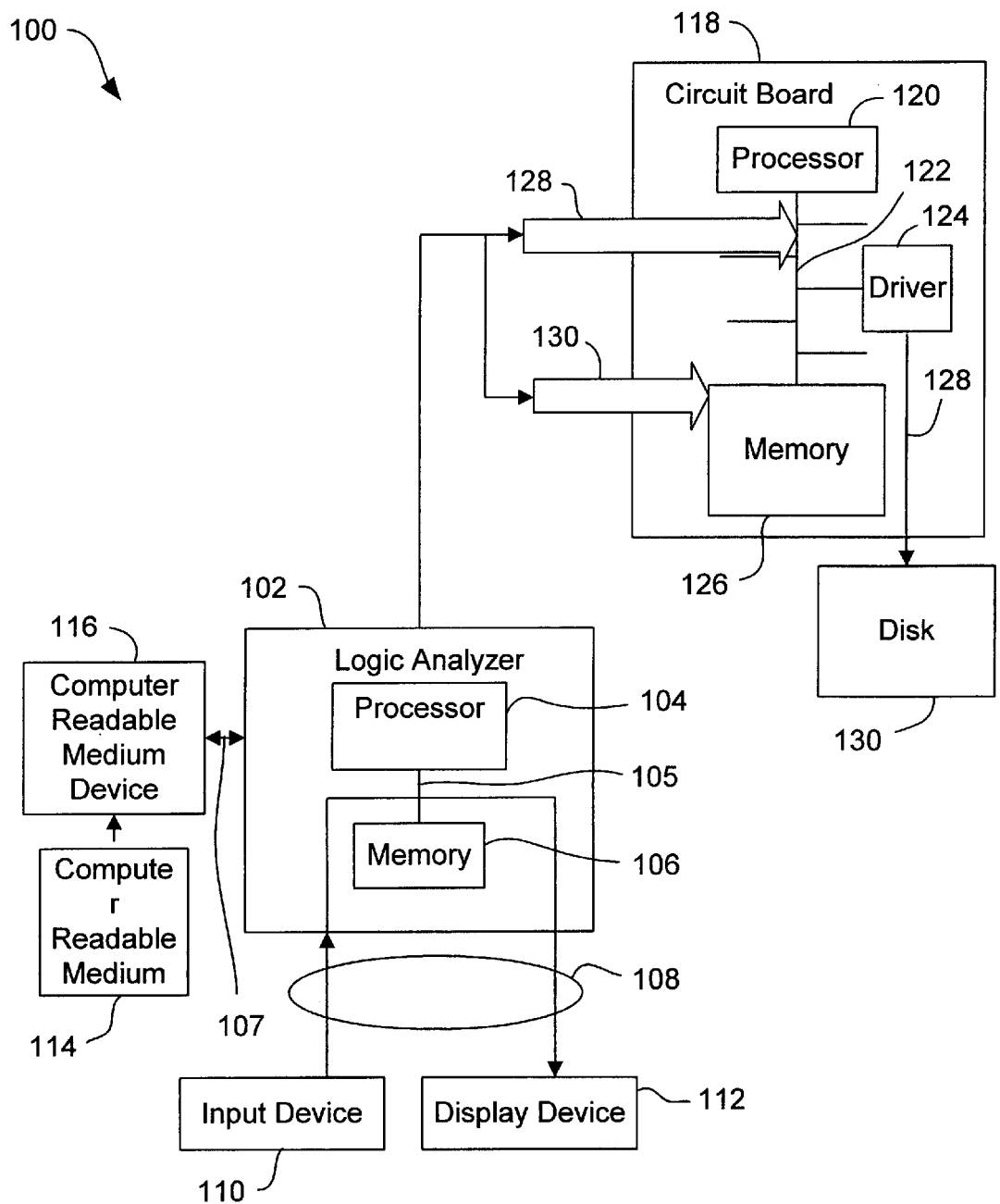
FIG. 1A shows a diagram of a conventional logic analyzer system.
Figure 1B:
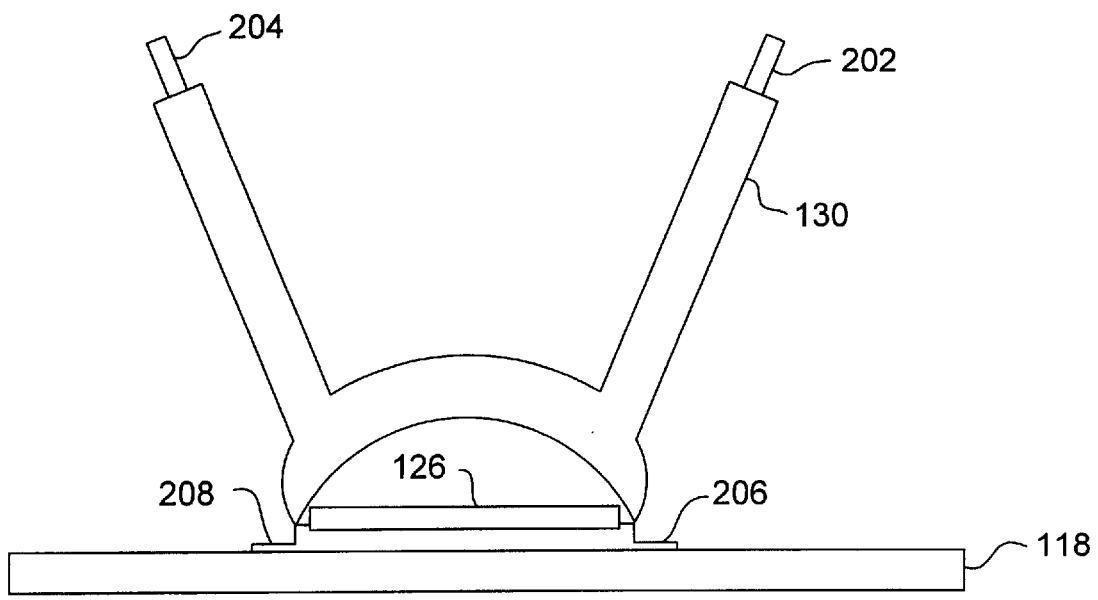
FIG. 1B shows a detailed view of the chip adapter of the conventional logic analyzer system of FIG. 1A.
Figure 2:
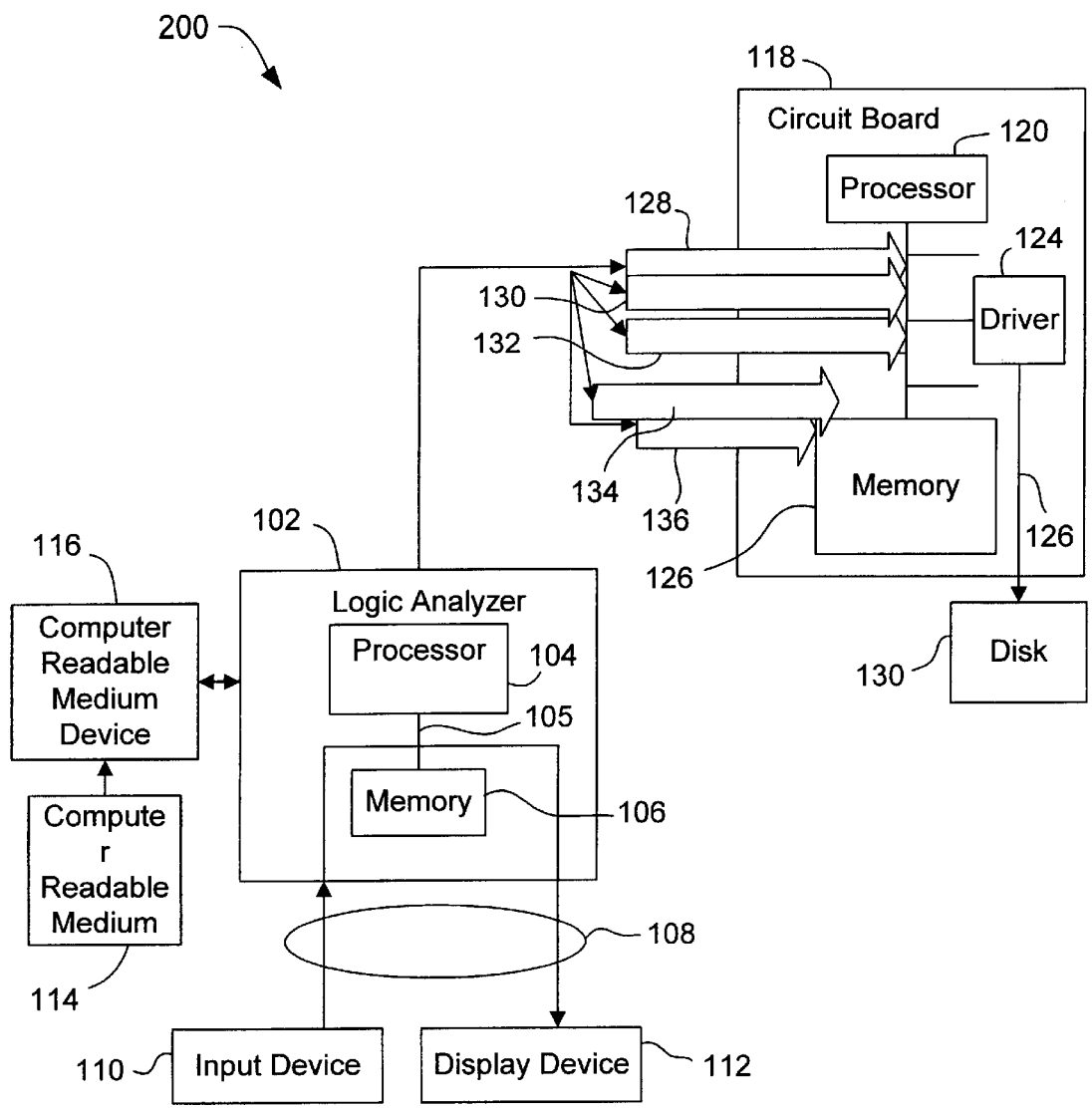
FIG. 2 shows a diagram of the conventional logic analyzer system of FIG. 1A where adapters overlap when testing a high density circuit board.
Figure 3A:
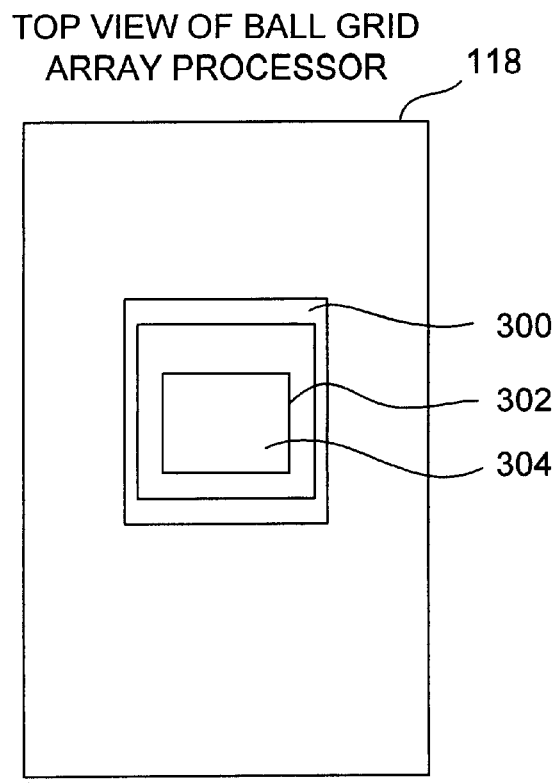
FIG. 3A shows a diagram of a front view of a ball grid array processor mounted to a circuit board.
Figure 3B:
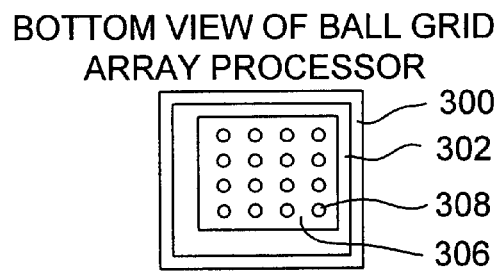
FIG. 3B shows a diagram of a rear view of the ball grid array processor of FIG. 3A.
Figure 3C:
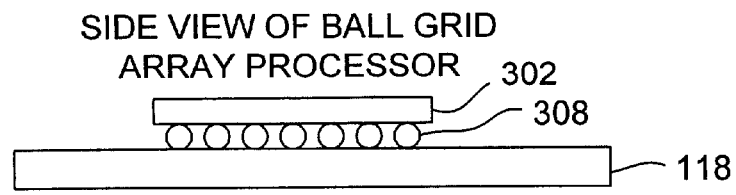
FIG. 3C shows a diagram of a side view of the ball grid array processor of FIG. 3A.
Figure 4:
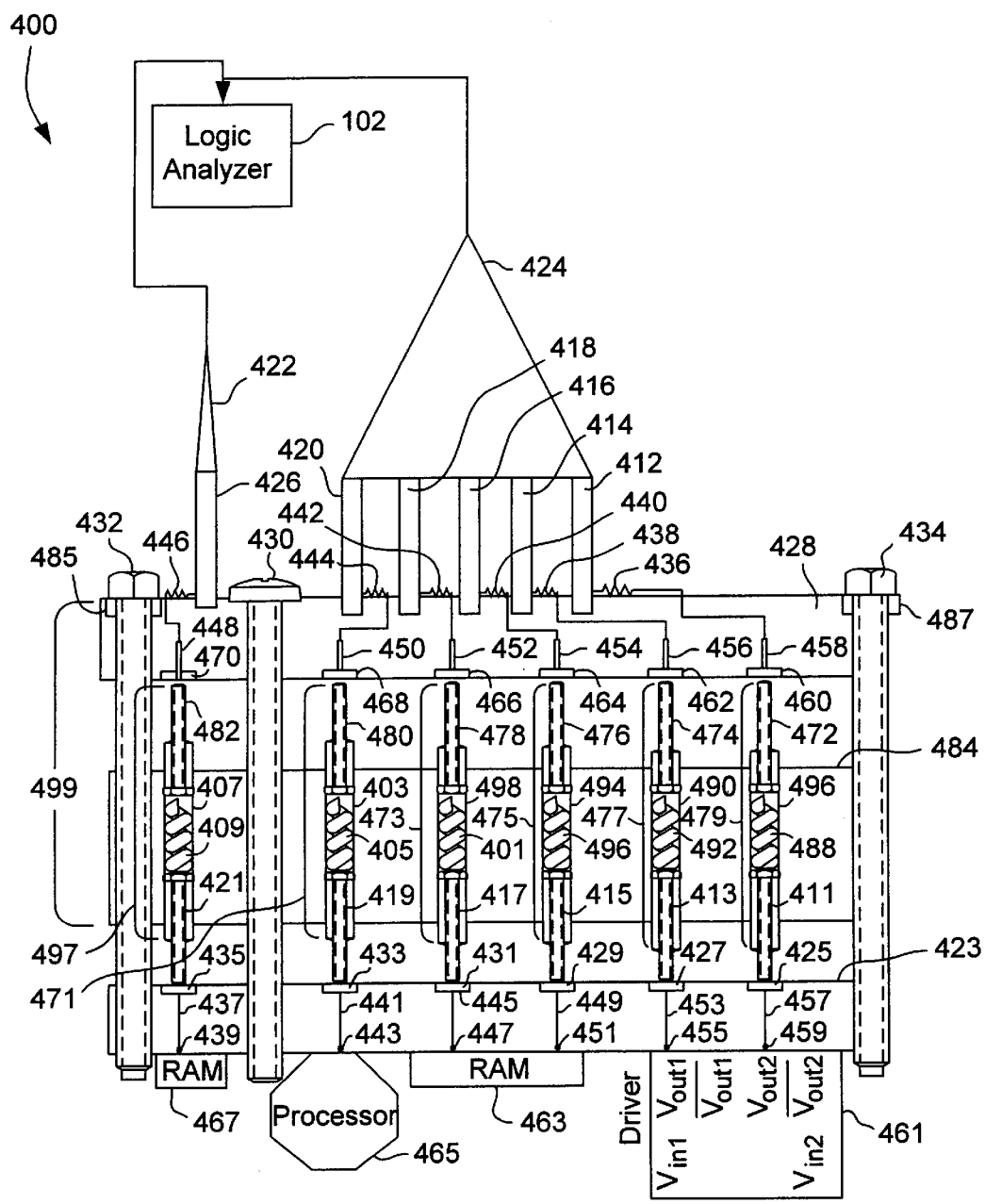
FIG. 4 shows a detailed block diagram of the Probe Board in accordance with the present invention.

Referring first to FIG. 4, the Probe Board 499 is an assembly consisting of a "probe plate" 484 and an "interface" board 428. The two assembly boards are coupled together to form Probe Board 499.

In a preferred embodiment, probe plate 484 is a thick fiberglass (e.g., FR4) board that include a large collection of holes. Each hole includes a double-sided, spring-loaded probe assembly (471, 473, 475, 477 and 479). One end of each double-sided, spring loaded probe (421, 419, 417, 415, 413 and 411) of probe plate 484 receives signals from a respective signal-accessible test point (e.g., 439, 447, 451, 455 and 459) of printed circuit board 423. The opposite end of each double-sided, spring-loaded probe (482, 480, 478, 476, 474 and 472) of probe plate 484 mates with respective test points (470, 468, 466, 464, 462 and 460) of interface board 428. The structure of probe plate 484 serves as a solid foundation for embedding and structurally supporting the probes.

Each probe assembly (497, 471, 473, 475, 477 and 479) includes a respective barrel (407, 403, 498, 494, 490 and 486) that includes a spring-loaded probe on both ends. For instance, probe barrel 407 include spring-loaded probes 482 and 421, probe barrel 471 includes spring-loaded probes 480 and 419, probe barrel 498 includes spring-loaded probes 478 and 417, probe barrel 494 includes spring-loaded probes 476 and 415, probe barrel 477 includes spring-loaded probes 474 and 413, and probe barrel 479 includes spring-loaded probes 472 and 411. It will be appreciated that during the manufacturing process probe assemblies (497, 471, 473, 475, 477 and 479) are embedded within probe plate 484. Hereafter, the probe assembly will be referred to as "probe."

Probe plate 484 contains one or more guide pins 430 that are located at the same X-Y coordinates as the mounting holes of UUT 423. Exemplary guide pin 430 helps to align the probes to the test points as probe plate 484 is pressed and attached to UUT 423. The tolerance of the guide pins should be such that all probes are aligned with their respective test point. Probe plate 484 also contains actuator screws 432 and 434 which are aligned with mounting holes located on UUT 423. When probe plate 484 is attached to UUT 423, screws 432 and 434 of probe plate 484 mate with the mounting holes of UUT 423. Screws 432 and 434 extend completely through UUT 423 and protrude enough to be secured with a threaded standoff nut 481 and 482. It will be appreciated that Probe Board 499 may not include guide pins, since the screws may provide adequate pressure and guidance to align the assembly boards.

It will be appreciated that foresight must be used during product development to ensure that mounting holes are configured across UUT 423 in a configuration that causes uniform pressure to be applied between UUT 423 and probe plate 484. It will further be appreciated that screws 432 and 434 need to apply a level of pressure on Probe Board 499 to establish a good, unimpeded connection between each spring-loaded probe (497, 471, 473, 475, 477 and 479) and each corresponding test point (439, 443, 447, 451, 455 and 459). One of ordinary skill in the art will recognize that screws 432 and 434 may need to provide a significant level of force. For example, although each probe (497, 471, 473, 475, 477 and 479) may only include a respective two-ounce spring (409, 405, 401, 496, 492 and 488) where each example probe provides a minuscule amount of force, probe plate 484 may include a thousand or more probes concentrated in a small area that would collectively create significant spring tension. Hence, the mounting screws need to provide pressure which ensures that all probes soundly contact with UUT 423.

It will also be appreciated that screws (432 and 434) and the mounting holes provided for insertion of the screws serve the important function of preventing UUT 423 from bowing under pressure. A UUT may bow under pressure because UUTs are relatively thin and easily flexed when pressed against the force of several hundred spring-loaded probes. Bowing is not desirable since traces can be stressed to the point of damage, and the bonding of surface mounted components on a UUT can break. Hence, to prevent UUT 423 from bowing, an adequate number of mounting holes and screws should be spaced apart at a distance that provides solid support of UUT 423 under pressure. The spacing requirements depend on the thickness of UUT 423 and the concentrations of test points for mating with the spring-loaded probes.

Interface board 428 is a printed circuit board that includes test pads (435, 433, 431, 429 427 and 425) on one side where each test pad mates against respective spring-loaded probes (497, 471, 473, 475, 477 and 479) of probe plate 484. The opposite side of interface board 428 includes logic analyzer headers 426 for rapid, ease-full connection to logic analyzer receptor 422, and logic analyzer headers (420, 418, 416, 414 and 412) for rapid, ease-full connection to logic analyzer receptor 424. It will be appreciated that each logic analyzer receptor accommodates one or more headers that are provided according to the configuration of interface board 428.

Each termination resistor (446, 444, 442, 440, 438 and 436) is provided near a respective header (426, 420, 418, 416, 414 and 412) for minimizing interference that may affect a given probe when testing a signal of a test point of UUT 423. Interface board 428 also includes mounting holes (not shown) for receiving either guide pin 430 and/or mounting screws 432 and 434 for supporting interface board 428 against the applied pressure of probes (497, 471, 473, 475, 477 and 479) of probe plate 484. Interface board 428 further includes signal information labels that identify the signals provided by each header including (426, 420, 418, 416, 414 and 412). It will be appreciated that in a preferred embodiment silk-screen labels may be used to identify the signal information.

One side of Interface board 428 contains test pads (470, 468, 466, 464, 462 and 460) positioned in matching X-Y coordinates to respective probe plate probes (482, 480, 478, 476, 474 and 472). Each probe forms a sound electrical connection with a respective test pad. The signals provided to each test pad are routed via traces within the signal layers of interface board 428 to a particular logic analyzer header (i.e., 426, 420, 418, 416, 414 and 412) located on the opposite side of interface board 428. To prevent UUT signal interference, one of the isolation resistors (446, 444, 442, 440, 438 and 436) are placed as-close-as possible to each test pad. Signals are routed and then grouped according to their functionality into a single header such as headers (426, 420, 418, 416, 414 and 412). For shielding, odd pins in a header are grounded so that only half of the header's pins are provided for signals. The headers are labeled with a functional description or title for easy identification. Also, individual signals such as the signal provided to header 426 are labeled for the same purpose.

Interface board 428 receives the same set of actuator screws 432 and 434 to prevent it from bowing when mating with the collection of probes (482, 480, 478, 476, 474 and 472) extending from probe plate 484. As discussed above with regard to UUT 423, interface board 428 is generally thin and can easily bow under the pressure of a collection of the spring-loaded probes. Hence, the mounting screws need to be adequately spaced over the surface of interface board 428 to distribute the pressure from the probes across interface board 428.

Figure 5:
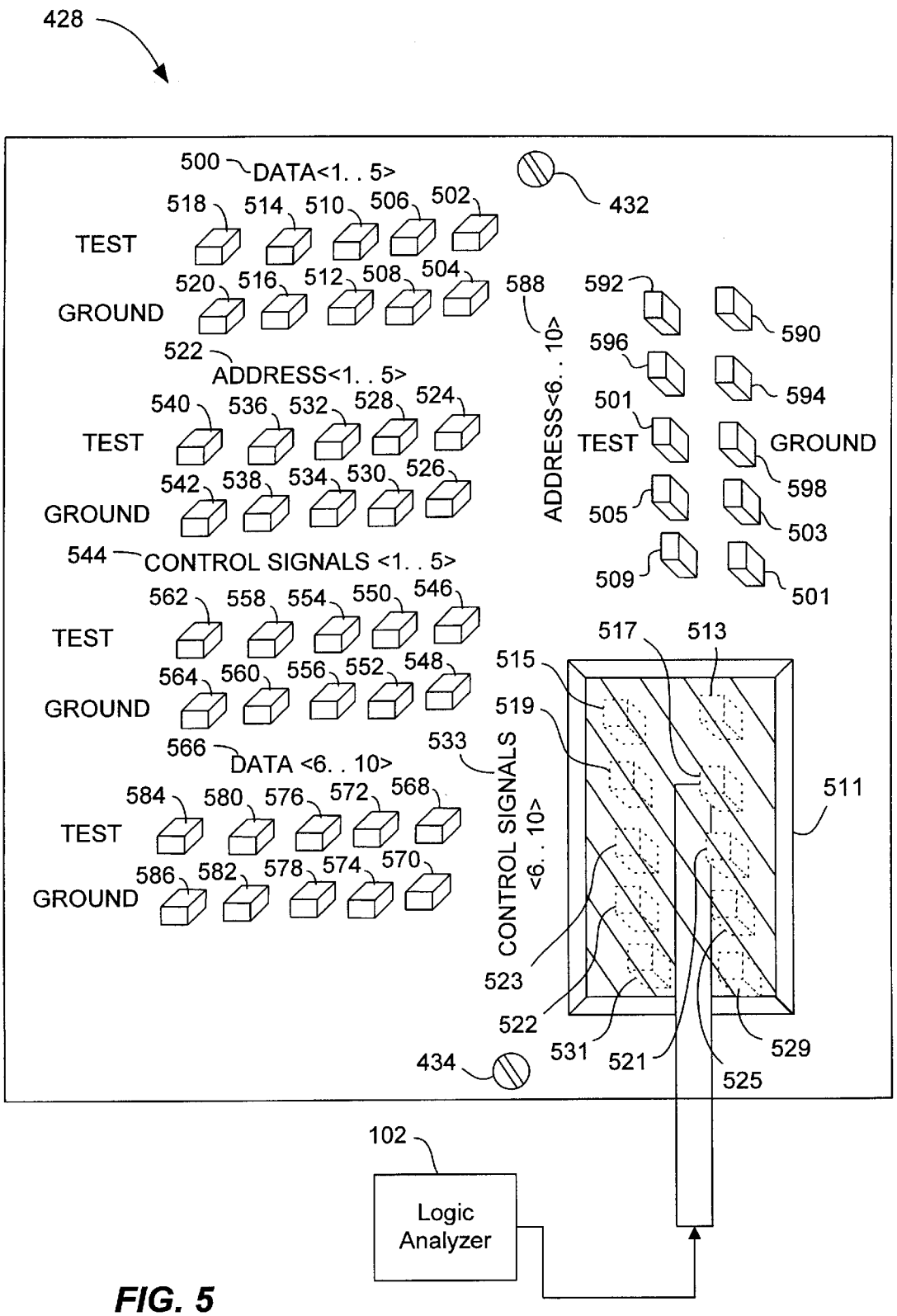
FIG. 5 shows a detailed block diagram of the interface board of the Probe Board of FIG. 4 in accordance with the present invention.

FIG. 5 shows in detail a diagram of a top view of interface board 428. As shown, there are six sets of ten headers. Headers are preferably grouped and labeled according to data source and functionality. For example, header set labeled "DATA<1..5>" includes headers (518, 514, 510, 506 and 502) where each header receives "data" and includes corresponding ground headers (520, 516, 512, 508 and 504). The header set labeled "ADDRESS<1..5>" includes headers (540, 536, 532, 528 and 524) where each header receives "address" information and includes corresponding ground headers (542, 538, 534, 530 and 526). The header set labeled "CONTROL SIGNALS<1..5>" includes headers (562, 558, 554, 550 and 546) where each header receives "control signals" and includes corresponding ground headers (564, 560, 556, 552 and 548).

Cables extending from Logic analyzer 102 test exemplary header set 533 that includes headers (513, 515, 517, 519, 521, 523, 525, 527, 529 and 531). Only one column of headers are used for signals. The pins in the second column are all grounded to improve signal integrity. Actuator screws 432 and 434 are also shown which ensure the interface board 428 is evenly and firmly mated with the probe plate 484. These screws help prevent flexing of interface board 428.

Now returning to FIG. 4, Probe Board 484 utilizes double-sided, spring-loaded probes (497, 471, 473, 475, 477 and 479) which are provided by various manufacturers. The tolerance associated with the distance between probe plate 484 and the rear side of UUT 423 should be taken into account when selecting probes. The probe must provide in a worst case spacing scenario between the two boards, a range of movement that results in solid contact between the probes and the UUT's test points. Several factors associated with the worst-case tolerance include the maximum height of a UUT component (e.g., SMT resistor package) and the maximum flex of the UUT under pressure. It will be appreciated that these same factors must also be taken into account for the opposite end of each probe which attaches to interface board 428.

It will be appreciated that the diameter of the probes should be selected according to the minimum distance between test points (435, 433, 431 449, 453 and 457) and also the minimum diameter of the test points provided. It will further be appreciated that the specifications of the probes should be chosen before constructing probe plate 484 so that the required thickness of probe plate 484 is known. One of ordinary skill in the art will recognize that another factor to consider is the style of the probe used. For example, a crown-style probe provides for a good connection to the test point and allows for a slightly wider tolerance in a probe-to-test point alignment. One of ordinary skill in the art will further recognize that there are numerous types of probes are available, and therefore, alternative probe boards will include a particular type according to the testing needs of that particular embodiment.

As discussed above, the mechanical interface between Probe Board assembly 499 and UUT 423 consists of a collection of actuator screws 432 and 434. Actuator screws 432 and 434 are press-fitted into probe plate 484 providing only a threaded screw exposed. When Probe Board 499 is mated with UUT 423, actuator screws 432 and 434 align with and extend through the mounting holes of UUT 423. Standoff nuts 481 and 482 are then attached to the protruding ends of respective screws 432 and 434 at the other side of UUT 423. It will be appreciated that standoff nuts 481 and 482 are preferably used since standoff nuts are easy to attach and tighten with only one's fingers. It will be further appreciated that, standoff nuts 481 and 482 are long enough to clear components such as RAM 467 or CPU 465 that may interfere with the finger-tightening sequence.

It will be further appreciated that Probe Board assembly 499 includes delicate probes on one side and headers on the other side. Therefore, in order to protect the probes, a side plate may preferably be attached along at least at two ends of Probe Board 499. When storing Probe Board 499 in the position of probe-side down on a flat surface, the side plates should be wide enough to prevent the probes from touching the surface. One of ordinary skill in the art will recognize that the side plates should guard the probes damage that could result from accidental bumping of Probe Board 499 against other objects.

The use of probes to monitor signals of UUT 423 can result in the unwanted affect of signal distortion. It will be appreciated that to prevent signal distortion, signal traces from probes should be terminated immediately after they leave a test point on interface board 423. This provides a degree of signal isolation and minimizes the affect of the signal trace on interface board 428.

It will be further appreciated that the impedance of interface board 428 should match the impedance of UUT 423 to maximize signal quality. Mismatched impedance between UUT 423 and Probe Board assembly 499 will result in signal degradation and effect the testing of UUT 423.

A wide collection of ground returns are required to maintain signal integrity between UUT 423 and Probe Board assembly 499. Grounding between the two boards occur via actuator screws (432 and 434). The holes on probe plate 484 which hold press-fitted actuator screws 432 and 434 each have a respective pad 485 and 487 connected to the probe plate's ground planes. Actuator screws 432 and 434 provide a solid electrical connection with ground pads 485 and 487.

Similarly, UUT mounting holes are required to have ground pads. When probe plate 484 is mated with UUT 423 and actuator screws 432 and 434 are protruding through the mounting holes of UUT 423, attaching respective standoff nuts 481 and 482 completes the electrical ground path for UUT 423 and probe plate 484.

Schematic information of UUT 423 is used to determine all of the signal nodes that Probe Board assembly 499 needs to access and analyze. The schematic information identifies each signal of UUT 423 that should be included in the header layout of interface board 428. For instance, signal interface board 428 should include for each signal under test, a test point located at pads (470, 468, 466, 464, 462 and 460). Each pad (470, 468, 466, 464, 462 and 460) connects to one side of respective termination resistor (446, 444, 442, 440, 438 and 436) with a respective trace and a via (448, 450, 452, 454, 456 and 458). Many different resistor types and sizes may be used, however, in a preferred embodiment 200 ohm resistors are used. Specific connector pins (426, 420, 418, 416, 414 and 412) each connect to the other side of respective termination resistor (446, 444, 442, 440, 438 and 436).

It will be appreciated that signals should be organized according to their functionality. Common signals should be grouped together to connect to a single header to provide a logical, user-friendly header/connector layout. It will also be appreciated that header names should logically associated with the functionality of the header's signal collection.

It will also be appreciated that that it is important to ensure that the terminating resistors (446, 444, 443, 440, 438 and 436) are located at the signal's test point. Hence, there should be minimal signal trace distance between each resistor and its destination connector.

It will also be appreciated that the test point placement should match the same X-Y coordinates as the mirrored test point found on the UUT layout. These same coordinates should also match the X-Y coordinate location of the probes found on the probe plate.

The header's name and signal should be visible on the silk-screen of interface board 428. The truncation of signal names may be necessary depending on available spacing. If a collection of headers share a common category, they can be placed in a localized area of interface board 428 and outlined with border to enhance usability.

An adequate number of mounting holes for actuator attachments should be provided depending on probe concentration and board thickness. The placement of these mounting holes should be maximized for the greatest board support.

The X-Y coordinate for all test points needed on UUT 423 should be translated from the interface board design to the probe plate design. Probe plate 484 should be drilled using these coordinates to place probes. The coordinates of the mounting holes on UUT 423 should also be translated to probe plate 484. Probes should then be inserted into the drilled vias.

Components on the backside of UUT 423 which extend past the travel distance of the probe tips must align with a cavity created on the probe plate. The dimensions of the object should be used to determine the dimensions of the cavity in the probe plate which are required.

It can therefore be appreciated that a new and novel method and apparatus for retrieving information to perform logic analysis of circuit boards has been described. It will be appreciated by those skilled in the art that, given the teaching herein, numerous alternatives and equivalents will be seen to exist which incorporate the invention disclosed hereby. As a result, the invention is not to be limited by the foregoing exemplary embodiments, but only by the following claims and equivalents thereof.

What is claimed is:

1. An analyzer board assembly system for retrieving signals from a circuit board and supplying the signals to a logic analyzer, the system comprising:

an interface board having one or more test pads on a first side of the interface board and a plurality of headers extending from a second side of the interface board for connecting the interface board to the logic analyzer, where each of the headers is mated to a corresponding one of a plurality of logic analyzer receptors of the logic analyzer; and a probe plate including one or more probes, where a first end of each probe electrically connects to a test point of the circuit board and an opposite end of each probe electrically connects to one of the one or more test pads on the first side of the interface board, wherein the probe plate retrieves the signals from the circuit board at the test point and transfers the signals via the interface board to the logic analyzer.

2. The system of claim 1, wherein each signal flows from one of the one or more test pads on the first side of the interface board, through the interface board and to one of the headers via a connector from the test pad to one of the headers.

3. The system of claim 2, wherein each of the connectors from each of the one or more test pads to each of the headers includes a resistor, located in close proximity to the headers, for minimizing signal interference.

4. The system of claim 1, wherein each probe is spring loaded, having a spring coupled between the first end and the opposite end of each probe to mechanically bias the first end of the probe against one of the test points of the circuit board and to mechanically bias the opposite end of each probe against one of the test pads of the interface board.

5. The system of claim 1, wherein the analyzer board assembly further includes screws for maintaining the interface board, the probe plate and the circuit board in a juxtaposed position, wherein the probe plate is positioned between the interface board and the circuit board.

6. The system of claim 5, wherein the interface board, the probe plate and the circuit board each include a corresponding aligned number of screw receptors, wherein each screw mates with one of the corresponding aligned screw receptors thereby holding the interface board, the probe plate and the circuit board in a position to promote complete signal contact therebetween.

7. The system of claim 6 further including a standoff nut attached to an end of each screw for firmly securing the interface board, the probe plate and the circuit board together.

8. The system of claim 1, wherein the analyzer board assembly further includes guide pins for maintaining the interface board, the probe plate and the circuit board in a juxtaposed position, wherein the probe plate is positioned between the interface board and the circuit board.

9. A method for providing an interface to retrieve signals from a plurality of test points of a circuit board and to supply the signals to a logic analyzer, the method comprising:

providing a probe plate that includes one or more probes electrically biased to receive signals from test points of the circuit board; and providing an interface board that includes headers, wherein the interface board is electrically biased to receive signals from the probe plate, and the logic analyzer via the headers of the interface board is electrically biased to receive the signals to perform circuit board analysis.

10. The method of claim 9, further comprising the step of:

mating the probe plate to the interface board and the interface board to the circuit board in an electrically connective relationship.

11. The method of claim 10, wherein the mating step includes:

fixing one or more connectors through a respective aligned mating receptor provided on the interface board, the probe plate and the circuit board, wherein the connectors and receptors are spaced apart.

12. The method of claim 11, wherein the connectors are screws.

13. The method of claim 9, wherein the step of providing a probe plate includes:

positioning each probe to receive at least one signal from one of the test points of the circuit board.

* * * * *